United States Patent
Li et al.

(10) Patent No.: US 9,640,237 B1
(45) Date of Patent: May 2, 2017

(54) ACCESS METHODS AND CIRCUITS FOR MEMORY DEVICES HAVING MULTIPLE CHANNELS AND MULTIPLE BANKS

(71) Applicant: CYPRESS SEMICONDUCTOR CORPORATION, San Jose, CA (US)

(72) Inventors: Jun Li, Fremont, CA (US); Joseph Tzou, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/866,260

(22) Filed: Sep. 25, 2015

Related U.S. Application Data

(63) Continuation-in-part of application No. 14/258,950, filed on Apr. 22, 2014, which is a continuation of application No. 13/727,505, filed on Dec. 26, 2012, now Pat. No. 8,705,310.

(60) Provisional application No. 61/693,090, filed on Aug. 24, 2012, provisional application No. 62/198,532, filed on Jul. 29, 2015.

(51) Int. Cl.
| | |
|---|---|
| *G11C 8/12* | (2006.01) |
| *G11C 8/18* | (2006.01) |
| *G11C 7/10* | (2006.01) |
| *G11C 11/413* | (2006.01) |
| *G11C 11/418* | (2006.01) |
| *G06F 13/42* | (2006.01) |
| *G11C 11/419* | (2006.01) |

(52) U.S. Cl.
CPC ............ *G11C 8/18* (2013.01); *G06F 13/4243* (2013.01); *G11C 7/1042* (2013.01); *G11C 8/12* (2013.01); *G11C 11/413* (2013.01); *G11C 11/418* (2013.01); *G11C 11/419* (2013.01)

(58) Field of Classification Search
CPC ....................................................... G11C 8/12
USPC .... 365/154, 189.04, 189.19, 230.03, 233.11, 365/233.13
See application file for complete search history.

(56) References Cited

U.S. PATENT DOCUMENTS

| | | | |
|---|---|---|---|
| 4,796,232 A | 1/1989 | House | |
| 4,887,240 A * | 12/1989 | Garverick | ............. G11C 11/406 365/189.04 |
| 5,831,906 A | 11/1998 | Yih et al. | |
| 5,875,470 A | 2/1999 | Dreibelbis et al. | |
| 5,991,230 A | 11/1999 | Urakawa | |

(Continued)

FOREIGN PATENT DOCUMENTS

JP  2009059452 A  3/2009

OTHER PUBLICATIONS

US 5,600,693, 07/2003, Kim Min (withdrawn)

(Continued)

*Primary Examiner* — Huan Hoang
*Assistant Examiner* — Jay Radke

(57) ABSTRACT

An integrated circuit (IC) device can include a plurality of banks, each including a plurality of memory cells, and separately accessible according to a received bank address value, each bank configured to enable accesses on different phases of an internal clock signal; and a plurality of channel groups, each channel group including a plurality of channels, each channel including its own data connections, address connections, and control input connections for accessing the banks, the channels of different groups accessing the memory banks on the different phases of the internal clock signal.

20 Claims, 13 Drawing Sheets

(56) References Cited

U.S. PATENT DOCUMENTS

| | | | |
|---|---|---|---|
| 6,166,946 A | 12/2000 | Naffziger | |
| 6,205,523 B1 | 3/2001 | Joffe et al. | |
| 6,272,067 B1 | 8/2001 | Sun et al. | |
| 6,314,047 B1 | 11/2001 | Keay et al. | |
| 6,324,104 B1* | 11/2001 | Matsui | G06F 12/0893 365/200 |
| 6,381,684 B1* | 4/2002 | Hronik | G11C 7/10 365/189.04 |
| 6,489,819 B1* | 12/2002 | Kono | G11C 29/14 327/141 |
| 6,584,036 B2 | 6/2003 | Kurjanowicz et al. | |
| 6,745,277 B1 | 6/2004 | Lee et al. | |
| 6,967,861 B2 | 11/2005 | Braceras et al. | |
| 7,142,477 B1 | 11/2006 | Tran et al. | |
| 7,327,597 B1 | 2/2008 | Wong | |
| 7,653,780 B2 | 1/2010 | Takahashi | |
| 7,990,973 B2 | 8/2011 | Hao et al. | |
| 8,149,643 B2 | 4/2012 | Tzou et al. | |
| 8,705,310 B2 | 4/2014 | Tran et al. | |
| 2001/0017792 A1* | 8/2001 | Takahashi | G11C 7/1006 365/189.07 |
| 2004/0240288 A1 | 12/2004 | Takahashi | |
| 2005/0210215 A1 | 9/2005 | Sezaki et al. | |
| 2006/0193160 A1* | 8/2006 | Hanzawa | G11C 15/04 365/49.15 |
| 2006/0292292 A1* | 12/2006 | Brightman | H04L 49/10 427/66 |
| 2008/0133809 A1 | 6/2008 | Saito et al. | |
| 2009/0282316 A1* | 11/2009 | Lingam | H03M 13/11 714/763 |
| 2009/0323454 A1 | 12/2009 | Noh | |
| 2010/0103762 A1* | 4/2010 | Tzou | G11C 8/18 365/230.03 |
| 2011/0058421 A1* | 3/2011 | Warren | G11O 5/063 365/185.11 |
| 2012/0008378 A1 | 1/2012 | Maheshwari | |
| 2012/0243301 A1* | 9/2012 | Maheshwari | G11C 7/1039 365/154 |
| 2014/0340978 A1 | 11/2014 | Tran et al. | |

OTHER PUBLICATIONS

U.S. Appl. No. 14/258,950, filed Apr. 22, 2014, parent of the present continuation-in-part application.
Altera Corporation, QDR SRAM Controller Function, Application Note 133, ver 1.0, Dec. 2000.
Altera Corporation, "QDR SRAM Controller Reference Design for Stratix & Stratix GX Devices", Application Note 349, ver 1.0, May 2004.
Interfacing Xilinx Spartan-II FPGA, http://www.datasheets.org.uk/CY7C1302_CY7C1304/Datasheet-09/DSA00154448.html; 3 pages.
International Search Report for International Application No. PCT/US2011/043481 dated Jan. 2, 2012; 3 pages.
USPTO Advisory Action for U.S. Appl. No. 13/179,307 dated Oct. 24, 2013; 2 pages.
USPTO Advisory Action for U.S. Appl. No. 13/179,307 dated Nov. 23, 2015; 3 pages.
USPTO Advisory Action for U.S. Appl. No. 13/727,505 dated Aug. 26, 2013; 3 pages.
USPTO Final Rejection for U.S. Appl. No. 13/179,307 dated Aug. 21, 2013; 32 pages.
USPTO Final Rejection for U.S. Appl. No. 13/179,307 dated Sep. 11, 2015; 20 pages.
USPTO Final Rejection for U.S. Appl. No. 13/179,307 dated Dec. 19, 2014; 20 pages.
USPTO Final Rejection for U.S. Appl. No. 14/258,950 dated Aug. 17, 2015; 19 pages.
USPTO Final-Rejection for U.S. Appl. No. 131727,505 dated Jul. 10, 2013; 15 pages.
USPTO Non Final Rejection for U.S. Appl. No. 13/727,505 dated Oct. 24, 2013; 12 pages.
USPTO Non-Final Rejection for U.S. Appl. No. 13/179,307 dated Feb. 19, 2013; 16 pages.
USPTO Non-Final Rejection for U.S. Appl. No. 13/179,307 dated Mar. 11, 2016; 18 pages.
USPTO Non-Final Rejection for U.S. Appl. No. 13/179,307 dated Jun. 18, 2015; 19 pages.
USPTO Non-Final Rejection for Application No. 13/179,307 dated Jul. 29, 2014; 18 pages.
USPTO Non-Final Rejection for Application No. 13/727,505 dated Mar. 15, 2013; 24 pages.
USPTO Non-Final Rejection for U.S. Appl. No. 14/258,950 dated Nov. 7, 2014; 19 pages.
USPTO Notice of Allowance for U.S. Appl. No. 13/727,505 dated Feb. 6, 2014; 8 pages.
USPTO Notice of Allowance for U.S. Appl. No. 14/258,950 dated Oct. 27, 2015; 8 pages.
White Electronics Design Corporation,"SSRAM Overview Application Note", Oct. 2001. 6 pages.
Written Opinion of the International Searching Authority for International Application No. PCT/US2011/043481 mailed Jan. 2, 2012; 4 pages.
SIPO Office Action for Application No. 201110263752.3 dated Apr. 5, 2016; 6 pages.
USPTO Notice of Allowance for U.S. Appl. No. 13/179,307 dated Jul. 1, 2016; 7 pages.
USPTO Notice of Allowance for U.S. Appl. No. 14/258,950 dated Mar. 2, 2016; 8 pages.
USPTO Notice of Allowance for U.S. Appl. No. 14/258,950 dated Jun. 21, 2016; 9 pages.
USPTO Notice of Allowance for U.S. Appl. No. 13/179,307 dated Oct. 6, 2016; 5 pages.
USPTO Notice of Allowance for U.S. Appl. No. 14/258,950 dated Oct. 11, 2016; 9 pages.

* cited by examiner

US 9,640,237 B1

ACCESS METHODS AND CIRCUITS FOR MEMORY DEVICES HAVING MULTIPLE CHANNELS AND MULTIPLE BANKS

This application is a continuation-in-part of U.S. patent application Ser. No. 14/258,950 filed on Apr. 22, 2014, which is a continuation of U.S. patent application Ser. No. 13/727,505 filed Dec. 26, 2012, which claims the benefit of provisional patent application Ser. No. 61/693,090 filed on Aug. 24, 2012. This application also claims the benefit of U.S. provisional patent application Ser. No. 62/198,532 filed on Jul. 29, 2015. The contents of all of these applications are incorporated by reference herein.

TECHNICAL FIELD

The present disclosure relates generally to memory devices, and more particularly to bank access methods for memory devices.

BACKGROUND

Memory devices, such as quad data rate static random access memories (SRAMs) can latch address values on both rising and falling edges of a timing clock for high speed, high throughput operations.

FIG. 10A is a timing diagram showing bank accesses for a conventional quad data rate SRAM device. FIG. 10A has waveforms for a timing clock CK, latched address values ADD, and operations within banks (Internal Ops). Letters "R" and "W" shown above waveform CK indicate the application of read and write commands. Letters "R" and "W" above the Internal Ops waveforms show the type of bank access executed within a bank.

Referring to FIG. 10A, at time t0, a read command can be received for an address in one bank (BNKA) on a rising edge of CK. At time t1, in response to the read command at time t0, the bank (BankA) can be accessed for a read operation.

Referring still to FIG. 10A, at time t2 a write command can be received for an address in another bank (BNKB) on a falling edge of CK. Such a write operation is not executed until a subsequent cycle (at time t6).

At time t3, another read command can be received on the next rising edge of CK. At time t4, the corresponding bank (BankC) can be accessed for the read operation.

At time t5, another write command can be received.

At time t6, a write operation in BankB can be performed in response to the bank address latched at time t2.

It is noted that in operations performed at the access speeds shown in FIG. 10A, there are no restrictions on bank addresses, as there is sufficient time between received commands (R and W of CK), as compared to the time needed to execute read and write operations within a bank (consecutive read and write operation of INTERNAL OPs).

FIG. 10B is a timing diagram showing bank accesses for a conventional quad data rate SRAM device, like that of FIG. 10A, but at a higher clock speed. FIG. 10B shows the same waveforms as FIG. 10A.

Referring to FIG. 10B, at time t3, a read operation can be executed in the bank latched at time t2. However, in the same general time period, a write operation to a BankX is being performed in response to a write command to BankX, issued in a previous clock cycle. Accordingly, the write operation to BankX and the read operation to BankC overlap one another.

Similarly, at time t5, the read operation to BankE (corresponding to BNKE latched at time t4) overlaps the write operation to BankB (corresponding to BNKB latched at time t1, in a previous cycle). At time at time t7, the read operation to BankG (corresponding to BNKG latched at time t6) overlaps the write operation to BankD (corresponding to BNKD latched at time t3, in a previous cycle).

To ensure proper operations, restrictions are placed on bank addresses so that the same bank is not subject to the overlapping read and write operations. Accordingly, as shown in FIG. 10B, BankC is restricted to not being the same as BankX (BankC !=BankX). Similarly, BankE !=BankB and BankG !=BankD.

Conventionally, to ensure such bank restrictions are maintained, a memory device can compare a read bank address (received on a rising edge of CK) to write bank addresses received in a previous clock cycle.

FIG. 10C shows a further restriction on a high speed memory device like that of FIG. 10B. FIG. 10C is a timing diagram showing how a write bank address can be switched in a conventional quad data rate SRAM. FIG. 10C shows the same waveform as FIG. 10B; however, unlike FIG. 10B, after the write to BankB at time t0, it is desired to switch to a new bank (BankF).

To ensure sufficient time is provided for comparing addresses, a "no operation" (NOP) cycle is inserted between times t2 and t3. It is understood that the access to BankF is delayed due to the insertion of the NOP cycle until time t7.

At time t4, following the NOP cycle, a read operation can be to any bank, as there is no possible overlapping write operation. Following time t4, read and write operations can continue as described, but with restrictions being based on the new write bank (BankF) received at time t1.

Accordingly, in response to a read operation at time t6, the corresponding BankD can be accessed for a read operation, but such a bank must be different from BankF, being accessed in response to the new write bank received at time t1.

DETAILED DESCRIPTION

Various embodiments will now be described that include memory devices, methods and systems that can enable accesses to any of multiple banks in response to simultaneous read or write operations from multiple channels. In some embodiments, channels can be arranged into channel groups, and accesses received in a same clock cycle from channels of different channel groups can access a same bank. Accesses received in a same clock cycle from channels of a same channel group can be prevented from accessing a same bank.

Figure 1A:
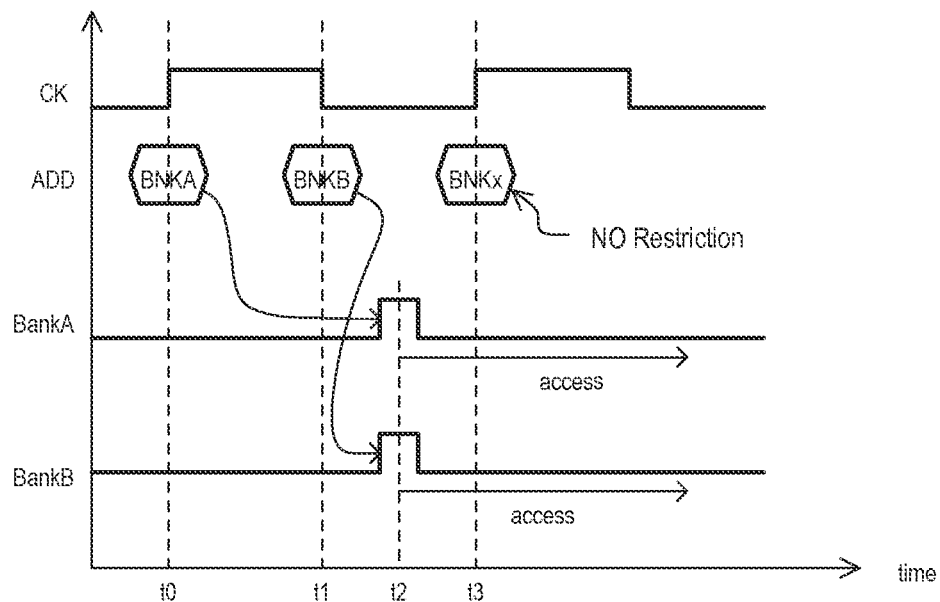
FIGS. 1A and 1B are timing diagrams showing bank access operations and limitations according to embodiments.

FIG. 1A is a timing diagram showing bank accesses and restrictions for a memory device according to embodiment. FIG. 1A has waveforms for a timing clock CK, latched bank address values ADD, and operations within banks (BankA, BankB).

Figure 10A:
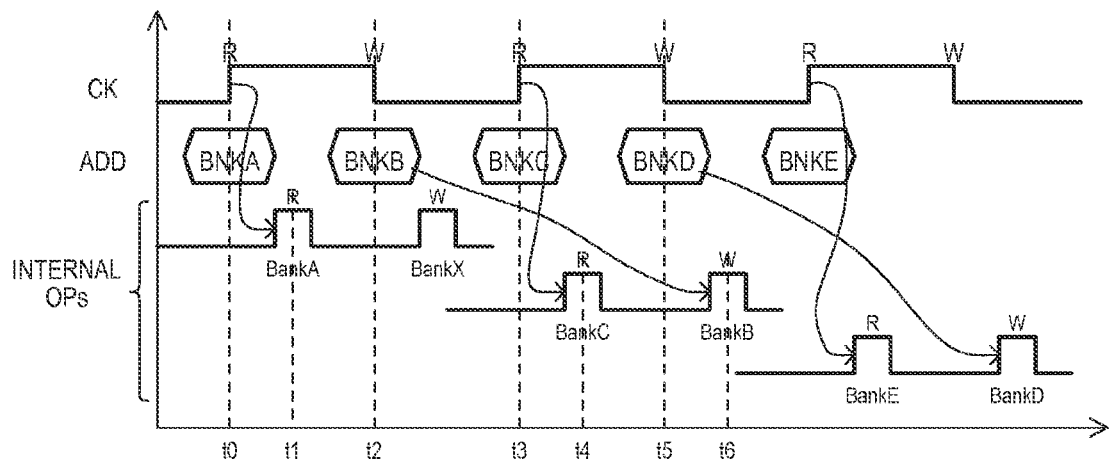
FIGS. 10A to 10C are timing diagrams showing conventional bank access operations and limitations.
Figure 10B:
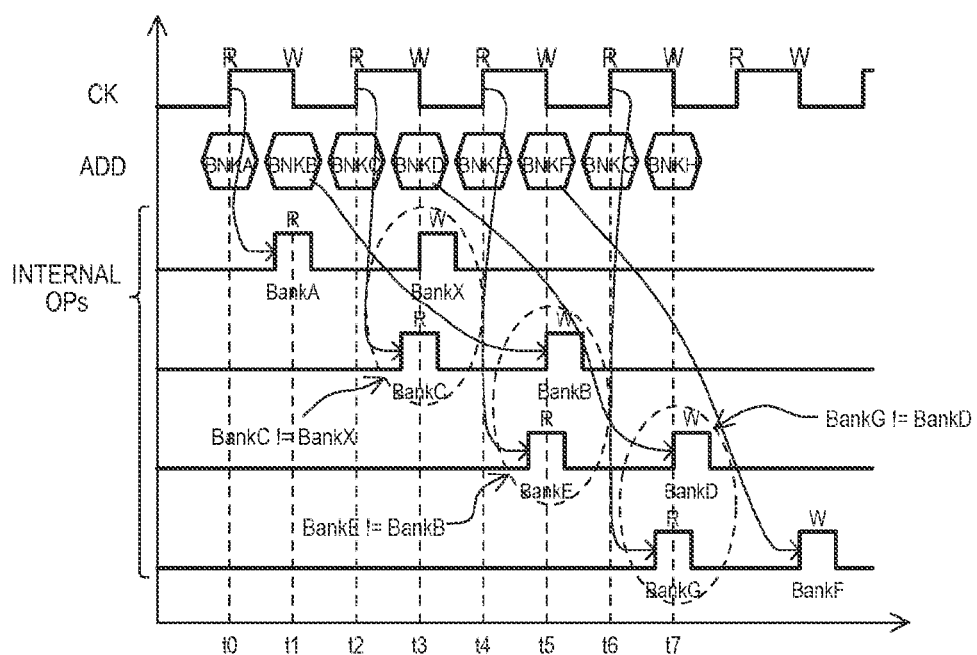

Referring to FIG. 1A, at time t0 a first command can be received for an address in one bank (BNKA) on a rising edge of CK. Unlike, a conventional operation, like that of FIG. 10A, an operation does not begin prior to the falling edge of the same cycle. Further, as will be described in more detail below, the address (BNKA) is not compared to any previous address to determine if the access is valid.

At time t1, in the same clock cycle, a second command can be received for an address on another bank (BNKB) on a falling edge of CK. An address received on a falling edge can be compared to that received on the rising edge of the same clock cycle. That is, in order for the operation to be valid, BNKB must correspond to a bank different from that of BNKA.

At time t2, after the falling edge of CK, and in response to the addresses received at both times t0 and t1 (i.e., in the same clock cycle), the corresponding banks (BankA and BankB) can be accessed in parallel. This is in contrast to a conventional operation, like that of FIG. 10A, where read accesses are started prior to write accesses initiated in a previous clock cycle.

At time t3, in the next clock cycle, another command can be received on the rising edge of CK directed to address in a bank (BNKx). However, in sharp contrast to conventional operations, there are no bank restrictions on such an access. That is, BNKx can be any bank of the memory device.

It is noted that in some embodiments, a type of access can be restricted according to clock transition type. In a very particular embodiment, read commands can be restricted to rising edges of CK, while write commands are restricted to falling edges of CK. However, in other embodiments any combination of operations can be accommodated on rising and falling clock transitions of a same cycle (e.g., read-read, read-write, write-read, write-write).

Figure 1B:
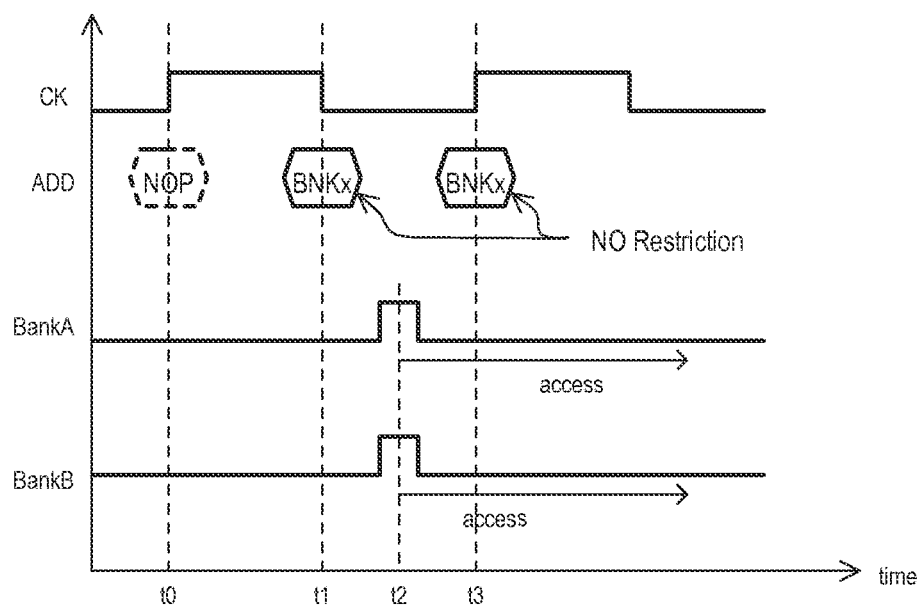

FIG. 1B is a timing diagram showing additional bank accesses and restrictions for a memory device according to an embodiment. FIG. 1B has the same waveforms as FIG. 1A.

FIG. 1B differs from FIG. 1A in that no operation is initiated at time t0. In such an operation, there are no restrictions on which bank is accessed on the falling edge of the same clock cycle (i.e., at time t1). The same freedom of access remains for the subsequent clock cycle (i.e., any bank can be accessed at time t3).

Figure 2A:
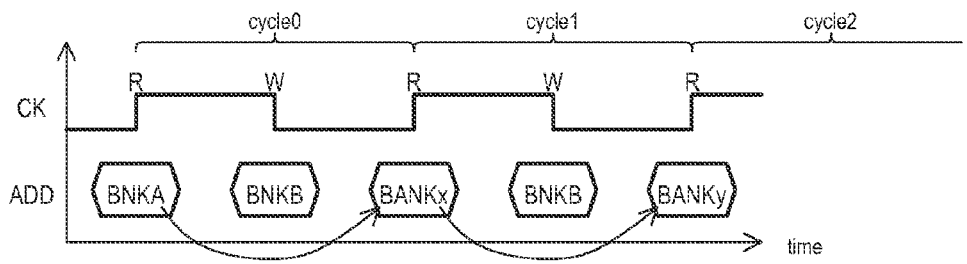
FIGS. 2A and 2B are timing diagrams showing bank access operations according to additional embodiments.
Figure 2B:
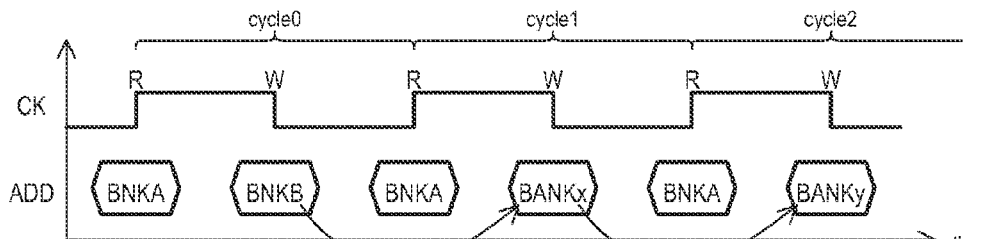
Figure 10C:
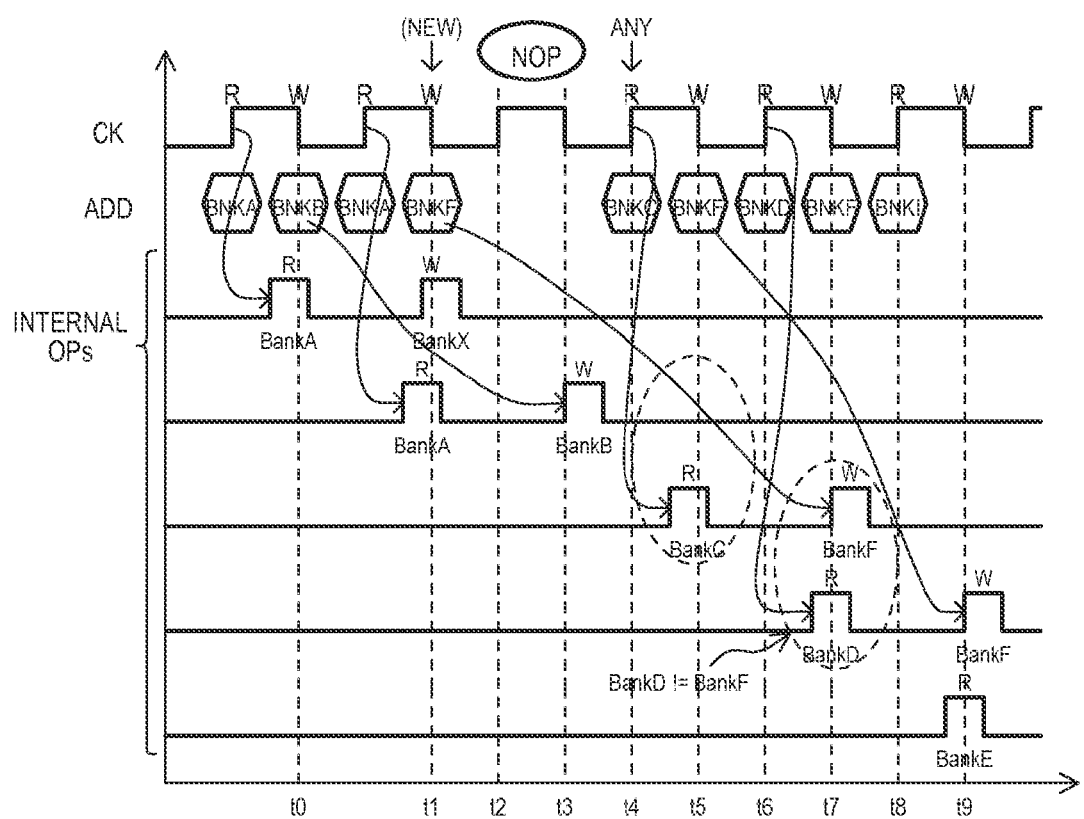

FIGS. 2A and 2B are timing diagrams showing memory accesses according to further embodiments. FIGS. 2A and 2B are timing diagrams showing how the insertions of "no operations" (NOPs) are not needed for accesses according to embodiments. FIGS. 2A and 2B show waveforms for a timing clock CK and latched bank address values ADD. Letters "R" and "W" shown above waveform CK indicate the application of read and write commands. As shown in FIG. 2A, read operations can jump between different banks (BNKA, BNKx, BNKy) in subsequent cycles (cycle0, cycle1, cycle2). Similarly, FIG. 2B shows how write operations can jump between different banks (BNKB, BNKx, BNKy) in subsequent cycles (cycle0, cycle1, cycle2). In all such transitions, a NOP is not inserted. This is in contrast to a conventional approach like that of FIG. 10C.

FIGS. 3A to 3F are a sequence of block schematic diagrams showing intra-cycle address comparison operations according to embodiments. FIGS. 3A to 3F show embodiments in which the only bank address comparison operation (to determine if an access is valid) occurs on the falling edge of the clock cycle. Said in another way, the embodiments shown a memory device in which the only address restriction occurs on the falling edge of a clock cycle, the restriction being that such an address cannot be the same as that received on the rising edge of the same clock cycle.

FIGS. 3A to 3F show a memory device 300 having a first register 302-0, a second register 302-1, and a comparator 304. A first register 302-0 can store at least a bank portion of an address (bank address) received on a rising edge of a timing clock (CK), while a second address register 302-1 can store a bank address received on a falling edge of the timing clock (CK). A comparator 304 can generate an indication (Conflict) in response to a comparison between bank address values.

Figures 3A, 3B, 3C:
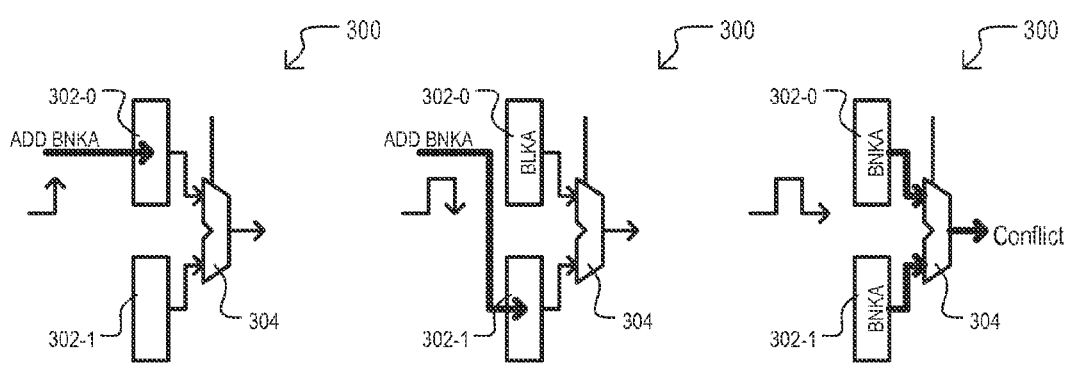
FIGS. 3A to 3F are a sequence of block diagrams showing intra cycle bank address compare operations according to embodiments.

FIGS. 3A to 3C show the generation of indication Conflict, according to one embodiment. FIG. 3A shows operations on a rising edge of signal CK. A first bank address (BNKA) can be stored in first register 302-0.

FIG. 3B shows operations on a falling edge of signal CK. A second bank address (BNKA) can be stored in second register 302-1.

FIG. 3C shows operations after the falling edge of signal CK. A comparator 304 can compare bank addresses in registers 302-0/1. In the embodiment shown, it is assumed that such bank addresses are the same, thus comparator 304 can activate a conflict signal (Conflict) to indicate the bank address received on the falling edge of a clock cycle is the same as that received on a rising edge of the same clock cycle.

Figures 3D, 3E, 3F:
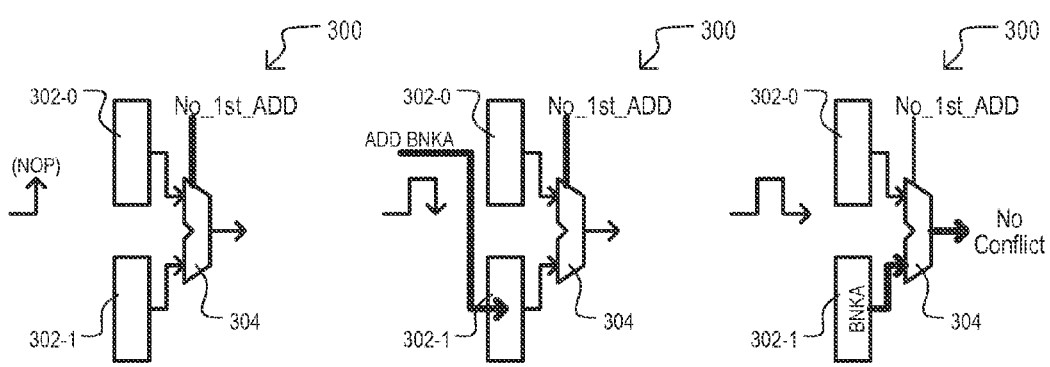

FIGS. 3D to 3F show bank limitation operations when no command is received on a rising edge of a clock cycle. FIG. 3D shows operations on a rising edge of signal CK. No command can be received. In the particular embodiment shown, such an event can activate a control signal No_1$^{st}$_ADD. Such a control signal can disable the compare operations of comparator 304.

FIG. 3E shows operations on a falling edge of signal CK. A bank address (BNKA) can be stored in second register 302-1.

FIG. 3F shows operations after the falling edge of signal CK. A comparator 304 can be disabled, thus a Conflict indication is not generated (represented by "No Conflict" in the figure). Such an operation shows how there can be no bank limitation for addresses received on a falling edge of a clocks signal.

Figure 4A:
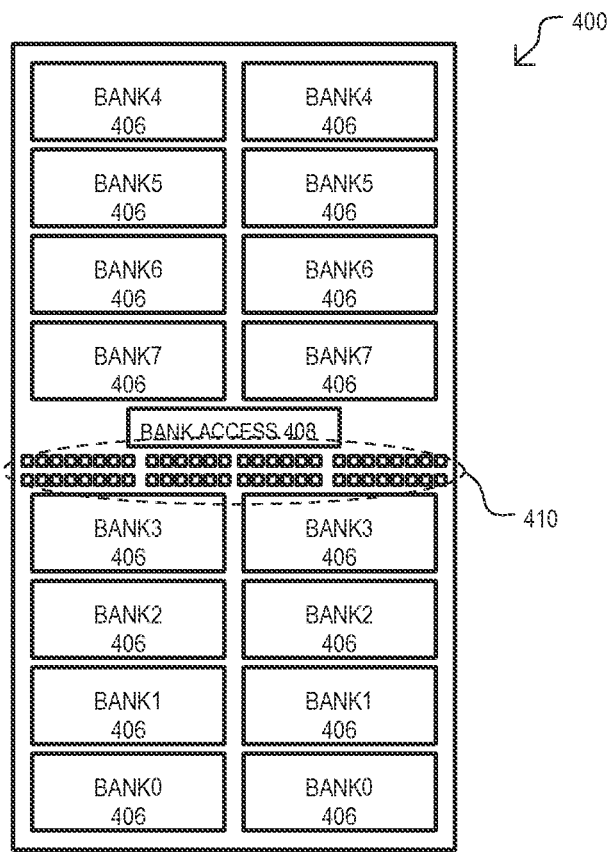
FIG. 4A is a block diagram of a memory device according to an embodiment.

FIG. 4A is a diagram showing the architecture of a memory device according to an embodiment. A memory device 400 can include multiple banks (BANK0 to BANK7), a bank access circuit 408, and input/output (I/O) connections 410. A memory device 400 can execute bank access operations as described herein, or an equivalent. In one embodiment, a memory device 400 can operate at a clock speed of 450 MHz or higher. That is, addresses can be latched on rising and falling edges of a clock running at 1 GHz or faster.

In the embodiment of FIG. 4A, each bank (BANK0 to BANK7) can be formed by two array sections 406. In one particular embodiment, array sections can include static random access memory (SRAM) cells arranged into rows and columns.

A bank access circuit 408 can provide the limited bank address comparison as described for embodiments herein. In some embodiments, bank access circuit 408 can limit accesses to banks (406) by comparing bank addresses received in the same clock cycle, and not with regard to any address received in a previous clock cycle. In a very particular embodiment, bank access circuit 408 can compare a bank address received on the falling edge of a clock cycle to any address received on the rising edge of the same cycle.

I/O connections 410 can provide connections to receive address signals and data signals, including inputs for write data and outputs for read data. In some embodiments, such connections can present a separated bus with separate inputs for write data (D) as compared to outputs for read data (Q). However, in other embodiments, one or more data buses can provide paths for read and write data (DQ buses).

Figure 4B:
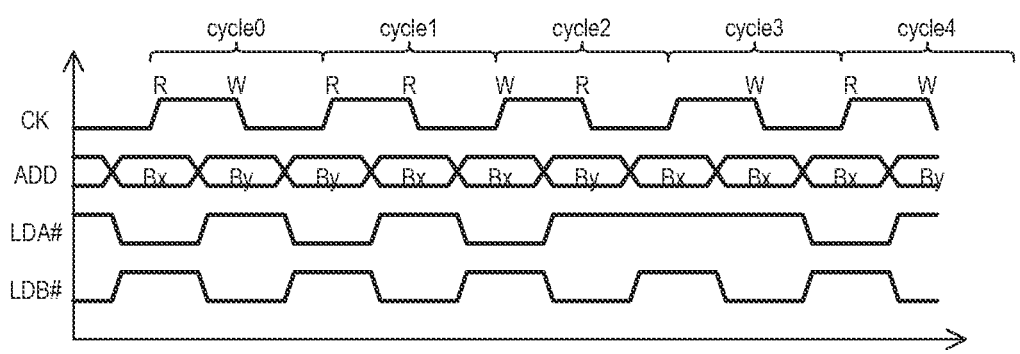
FIG. 4B is a timing diagram showing various combinations of access types for a memory device like that of FIG. 4A.

FIG. 4B is a timing diagram showing a variety of operations that can occur for an embodiment like that of FIG. 4A. FIG. 4B shows waveforms for a timing clock CK, latched bank address values ADD, a first port enable signal LDA#, and a second port enable signal LDB#. Letters "R" and "W" shown above waveform CK indicate the application of read and write commands. LDA# and LDB# are active low signals, with LDA# enabling its ports on rising edges of CK, and LDB# enabling its port on falling edges of CK.

As shown, various combinations of bank addresses (Bx, By) for various combinations of operations (R, W) can be received by the memory device. Unlike conventional approaches, like that of FIG. 10A, a read operation on a rising edge of cycle1 can access the same bank (Bx) as a write operation on the falling edge of previous cycle0. Similarly, a write operation on a rising edge of cycle2 can access the same bank (By) as a read operation on the falling edge of previous cycle1.

It is understood that in the very particular example of operations shown in FIG. 4B, no operation occurs on the rising edge of cycle3, as port enable signal LDA# is inactive (high) on the rising edge of cycle3.

While embodiments above have shown methods and devices that access two banks per cycle, alternate embodiments can access more than two banks per cycle. One such embodiment is shown in FIG. 5.

Figure 5:
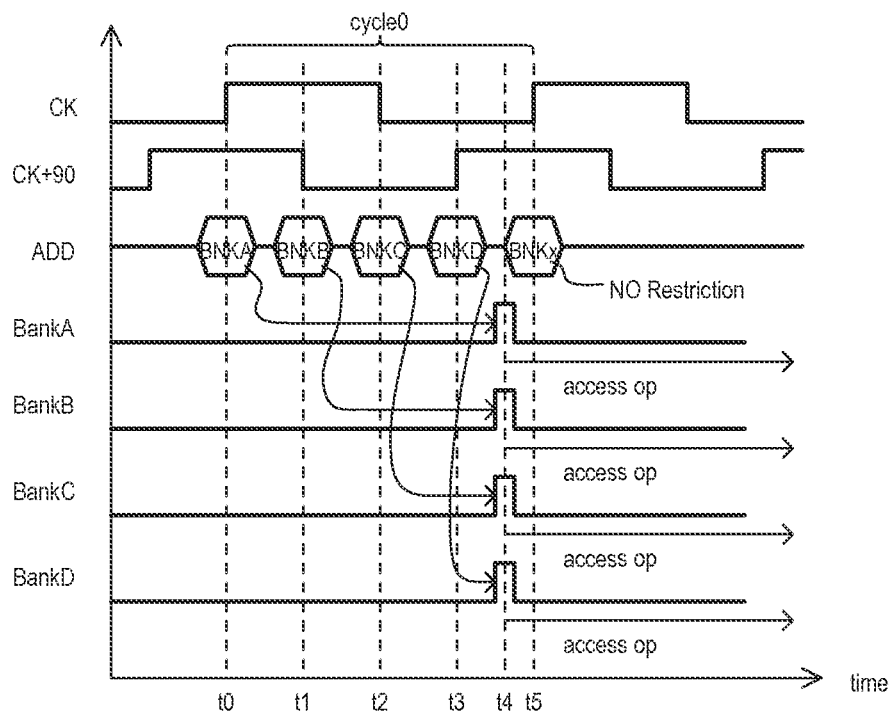
FIG. 5 is a timing diagram showing bank access operations for more than two banks according to one embodiment.

FIG. 5 is a timing diagram showing bank accesses and restrictions for a memory device according to embodiment. FIG. 5 has waveforms for a first timing clock CK, a second timing clock CK+90, latched bank address values ADD, and operations within four different banks (BankA, BankB, BankC, BankD).

Referring to FIG. 5, at time t0 a first command can be received for an address in one bank (BNKA) on a rising edge of CK. Three more commands can be received in the same clock cycle (cycle0) corresponding to bank addresses (BNKB, BNKC, BNKD). Bank restrictions can exist only for intra-cycle accesses. That is, BNKA, BNKB, BNKC, BNKD are different bank addresses. However, addresses in a next clock cycle (e.g., BNKx) can have no bank restrictions.

In some embodiments, a memory device having bank access operations as described herein, can operate with a latency. For example, read data can be output following a read latency (e.g., 8 cycles) after the reception of a read command. In addition, write data can be written into a memory bank after write-to-array latency (e.g., 13 clock cycles) following the initial storing (e.g., latching) of such write data. In such embodiments, write data and corresponding write addresses can be stored prior to write data being actually written into memory cells of the device.

To ensure data coherency, a memory device can include a late write circuit that enables such stored write data to be output in response to read addresses. One such embodiment is shown in FIG. 6.

Figure 6:
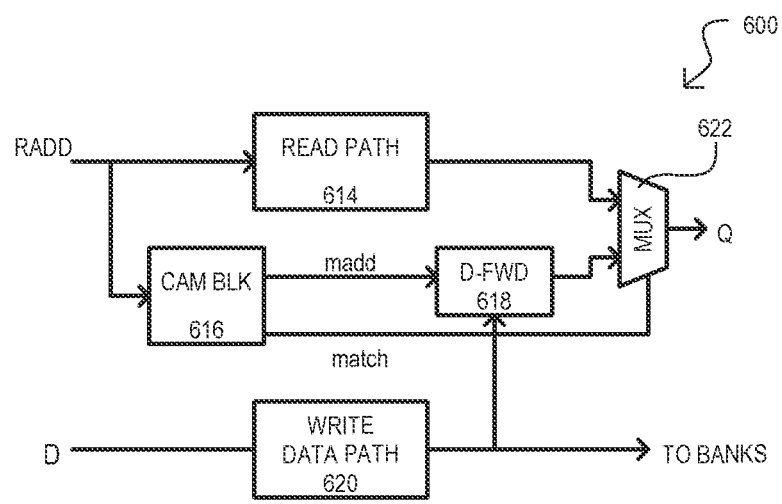
FIG. 6 is a block diagram of a memory device having a late write circuit according to an embodiment.

FIG. 6 shows a memory device 600 that includes a read path 614, a CAM block 616, a write data store 618, a multiplexer (MUX) 622, and a write data path 620. A read path 614 can include memory banks and other suitable circuits (decoders, sense amplifiers, etc.) to enable read accesses to memory cells of a memory cell array (i.e., a standard read access).

A CAM block 616 can store address values for write data that is subsequently stored in memory banks of the device (i.e., is subject to a write-to-array latency). A CAM block 616 can compare a received read address to such stored write addresses to see if the read operation is intended for a location subject to a future write operation. A write data store 618 can store write data accessible by data output from a CAM block 616. A write data path 620 can include write data latches and other suitable circuits (e.g., write amplifiers, etc.) for inputting write data to the device.

In response to a read command and address, the read address (RADD) can be applied to read path 614. Such an operation can result in read data being output from a memory bank.

In addition, the read address (RADD) can also be applied to CAM block 616, where it can be compared to stored write addresses, substantially simultaneously. If a read address matches a stored write address, the matching address (madd) can be forwarded to write data store 618 and a match indication (match) can be activated. A match indication (match) can control a MUX 622.

Accordingly, if a read address does not match a write address stored in CAM block 616, a read data value from read path 614 can be output via MUX 622. However, if a read address matches a write address stored in CAM block 616, a write value from write data store 618 can be output via MUX 622 instead of that from a memory bank.

Figure 7:
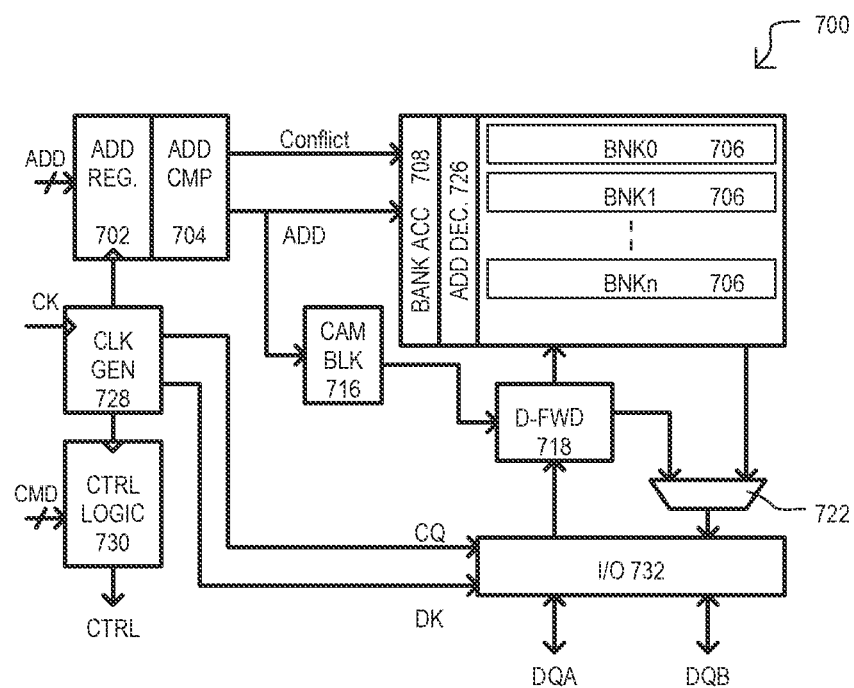
FIG. 7 is a block schematic diagram of a memory device according to another embodiment.

Referring to FIG. 7, a quadruple data rate (QDR) memory device 700 according to one embodiment is shown in a block schematic diagram. Memory device 700 can include a number of banks (BNK0 to BNKn), address register 702, bank address comparator 704, clock generator 728, CAM block 716, control logic 730, write data store 718, read data MUX 722, and an I/O path 732.

Memory blocks 706 can be accessed according to unique block addresses, which in some embodiments can be selected bits of a received address. Address decoder 726 can decode read and write addresses to access storage locations for read and write data (Q and D). In a particular embodiment, memory blocks 706 can have a dual port architecture, enabling simultaneous read and write accesses.

Address register 702 can store addresses received during single clock cycles as described herein, or an equivalent. Address comparator 704 can compare bank addresses received in a same clock cycle. In one particular embodiment, address comparator 704 can compare a bank address latched on a falling edge of a clock signal CK to that latched on the rising edge of the same clock cycle.

CAM block 716, write data store 718 and MUX 722 can operate as described for FIG. 6, comparing a read address to stored write addresses to ensure data coherency.

Clock generator circuit 728 can generate internal clock signals that are in synchronism with, but not necessarily phase aligned to, an input clock (CK). Such internal clock signals can include, but are not limited to, signals for latching address values (ADD), and latching data values in a double data rate (DDR) fashion, including a write data clock DK and read data clock CQ. Read data can be output in response to rising and falling edges of read data clock CQ, and write data can be latched on rising and falling edges of write data clock DK.

Control logic 730 can receive command data and determine when particular operations are to be executed by the memory device 700, including read and write operations. In response to such commands, control logic 730 can generate control signals (CTRL) for controlling various sections of the memory device 700.

It is understood that control logic 730 can include any of various interfaces. For example, in some embodiments, control logic 730 can have a synchronous SRAM interface. However, in alternate embodiments, control logic 730 can have a dynamic RAM (DRAM) type interface, latching bifurcated addresses (e.g., row addresses and column addresses) in response to particular control signals (e.g., /RAS, /CAS signals).

In addition or alternatively, while FIG. 7 shows two bi-directional data paths DQA/B (e.g., data ports), other embodiments can include separate read and write data buses, and more than two data ports. Further, alternate embodiments can include more than one address bus, for a very-wide I/O type memory device.

While the above embodiments have shown various devices, circuits and methods, additional methods will now be described with reference to flow diagrams.

Figure 8:
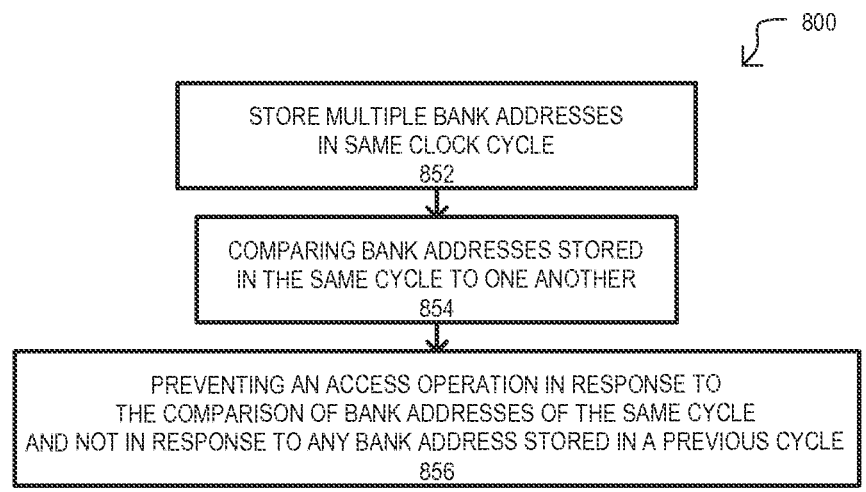
FIG. 8 is a flow diagram of a method according to an embodiment.

FIG. 8 is a flow diagram of a method 800 according to an embodiment. A method 800 can include storing multiple bank address in a same clock cycle (852). In some embodiments, such an action can include latching addresses on rising and falling edges of a clock cycle. Further in some embodiments such an action can include storing more than two bank addresses received in a single clock cycle. A method 800 can also include comparing bank addresses stored in the same clock cycle to one another (854). In one very particular embodiment, such an action can include comparing a bank address stored in a falling clock edge to that stored in the rising clock edge of the same clock cycle.

A method 800 can also include preventing an access operation in response to the comparison of bank addresses of the same cycle and not in response to any bank address stored in a previous cycle 856. Such an action is in sharp contrast to conventional approaches that compare a bank address received in one cycle to those received in a previous cycle.

Figure 9:
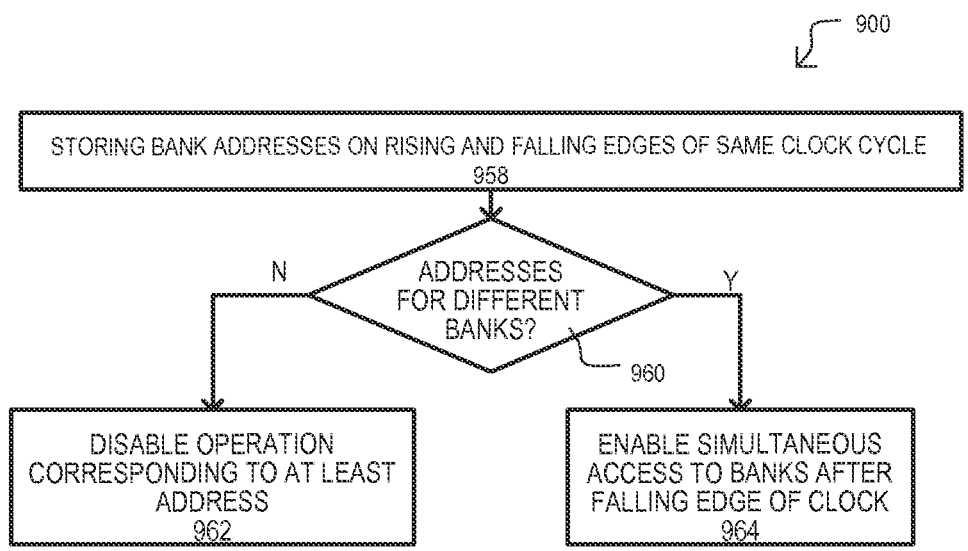
FIG. 9 is a flow diagram of a method according to another embodiment.

FIG. 9 is a flow diagram of a method 900 according to another embodiment. A method 900 can include storing bank addresses on rising and falling of the same clock cycle (958). A determination can be made to see if the bank addresses are for different banks (960). If the bank addresses are not for different banks (N from 960), one or all operations corresponding to the bank addresses can be disabled (962). If bank addresses are for different banks (Y from 960), simultaneous access to the banks can be enabled after the falling edge of the clock cycle (964).

Figure 11:
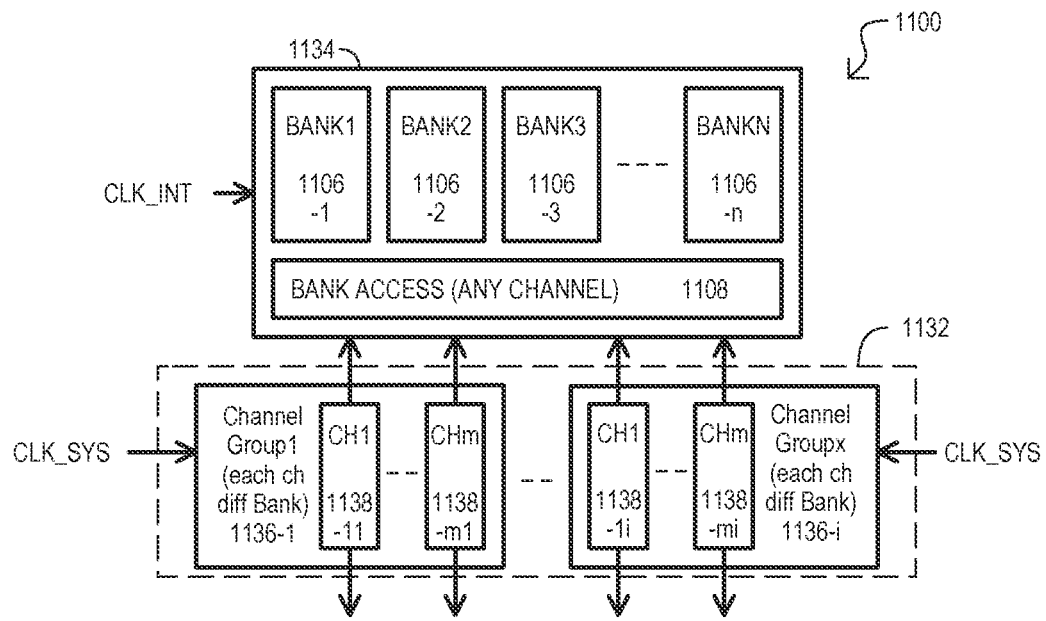
FIG. 11 is a block diagram of a memory device according to another embodiment.

FIG. 11 is a block schematic diagram of a memory device 1100 according to another embodiment. A memory device 1100 can include a memory section 1134 and an I/O section 1132. A memory section 1134 can include a number of banks 1106-1 to -n and a bank access circuit 1108. Banks (1106-1 to -n) can each include memory cells, as well as decoder circuits to access such memory circuits. Banks (1106-1 to -n) can be separately accessible according to a bank address unique to each memory bank (1106-1 to -n). While memory cells can be any suitable memory cell type, in one very particular embodiment memory cells can be SRAM type memory cells.

A bank access circuit 1108 can enable access to any bank (1106-1 to -n) from any channel 1138-11 to mi. In a particular embodiment, a bank access circuit 1108 can include a crossbar circuit or other type of circuit which can enable address/control (and for write operations data) to be applied from any channel (1138-11 to mi) to any bank (1106-1 to -n) based on a bank address, as but one example.

I/O section 1132 can include two or more channel groups 1136-1 to -i. Each channel group (1136-1 to -i) can include multiple channels, where each channel includes address, control and data connections to enable access to the memory banks (1106-1 to -n). In the example shown, channel group 1136-1 is shown to include channels 1138-11 to -m1, while channel group 1136-i is shown to include channels 1138-1i to -mi.

According to embodiments, a memory device 1100 can provide flexible access from multiple channels (1138-11 to -mi) to any of the banks (1106-1 to -n). In particular embodiments, accesses received in the same CLK_SYS cycle from channels of different channel groups (1136-1 to -i) can access any bank (1106-1 to -n) without restriction, including the same bank. Accesses received in the same CLK_SYS cycle from channels of a same channel group (1136-1 to -i) can access any bank (1106-1 to -n), except the same bank (1106-1 to -n).

Referring still to FIG. 11, in some embodiments, accesses to banks (1106-1 to -n) can occur more than one time within a same CLK_SYS cycle. In particular embodiments, access to banks (1106-1 to -n) within a cycle of CLK_SYS can be based on one or more internal clock signals (CLK_INT) which can have frequencies that are a multiple of CLK_SYS. However, any suitable timing arrangement can be employed, including phase shifting CLK_SYS to arrive at appropriate timing signals.

Figure 12:
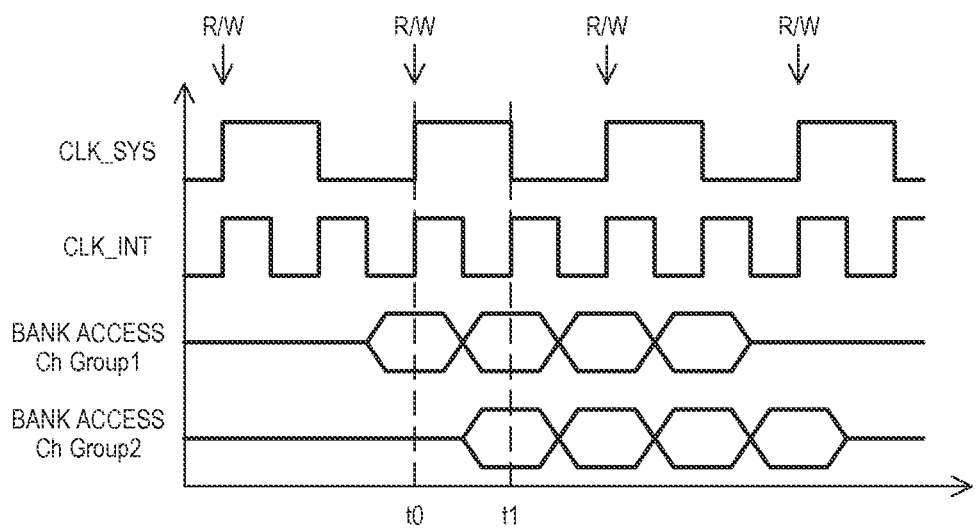
FIG. 12 is a timing diagram showing memory device operations according to an embodiment.

FIG. 12 is a timing diagram showing access operations to a memory device according to an embodiment. FIG. 12 includes waveforms for a system clock CLK_SYS, an internal clock CLK_INT, possible bank accesses from a first channel group (BANK ACCESS Ch Group1), and possible bank accesses from a second channel group (BANK ACCESS Ch Group2).

Access requests to a memory device at multiple channels can be received on rising edges of CLK_SYS (shown as R/W). Accesses to banks can be timed according to internal clock CLK_INT, with accesses from different particular channels groups being delayed with respect to one another. Thus, accesses from channels of one group (BANK ACCESS Ch Group2) can occur later in the same CLK_SYS cycle as accesses from channels of another group (BANK ACCESS Ch Group1). In the example shown, accesses from Group1 can occur at time t0, and on every other subsequent rising edges of clock CLK_INT. In contrast, accesses from Group2 received at the same time as those for Group1, can occur at time t1, on the rising edges that follow those for Group1. Thus, even if such accesses from channels of a different channel group are to a same bank, no conflict can occur as such accesses are phase shifted from one another.

Figure 13:
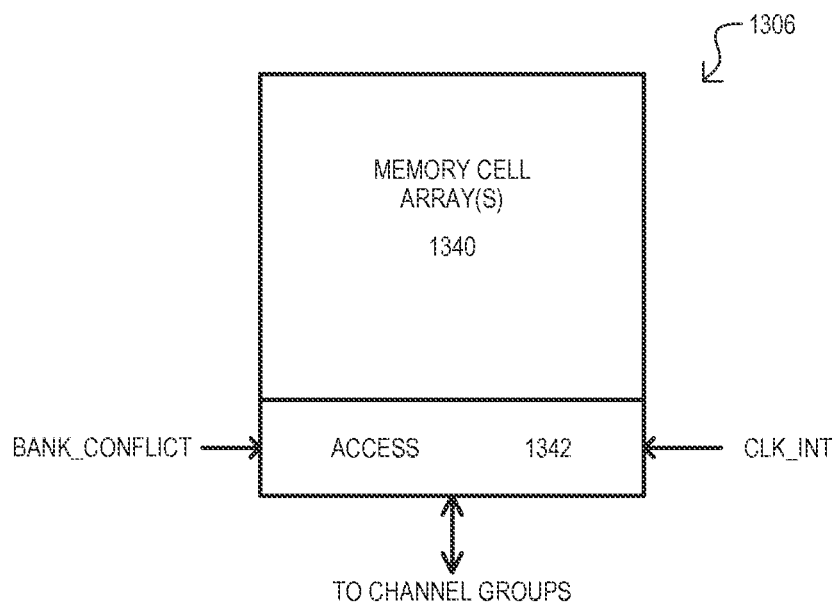
FIG. 13 is a block diagram of a bank that can be included in embodiments.

FIG. 13 is a block diagram of a bank 1306 that can be included in an embodiment. A bank 1306 can include one or more memory cell arrays 1340 and access circuits 1342. Access circuits 1342 can access memory cells within memory cell array(s) 1340 according to address and control information received on a channel. In the embodiment shown, access circuits 1342 can operate according to internal clock signal CLK_INT.

Optionally, a bank 1306 can also receive a bank conflict indication BANK_CONFLICT. In response to such an indication, access circuits 1342 can prevent access to the memory cell array(s) 1340. A bank conflict indication BANK_CONFLICT can be activated when two (or more) channels of a same channel group receive an access request to a same bank at the same time (or in the same input clock cycle). It is noted that in other embodiments, channel conflicts within a channel group can be handled at the channels themselves, and banks (e.g., 1306) do not receive a bank conflict indication BANK_CONFLICT.

Figure 14:
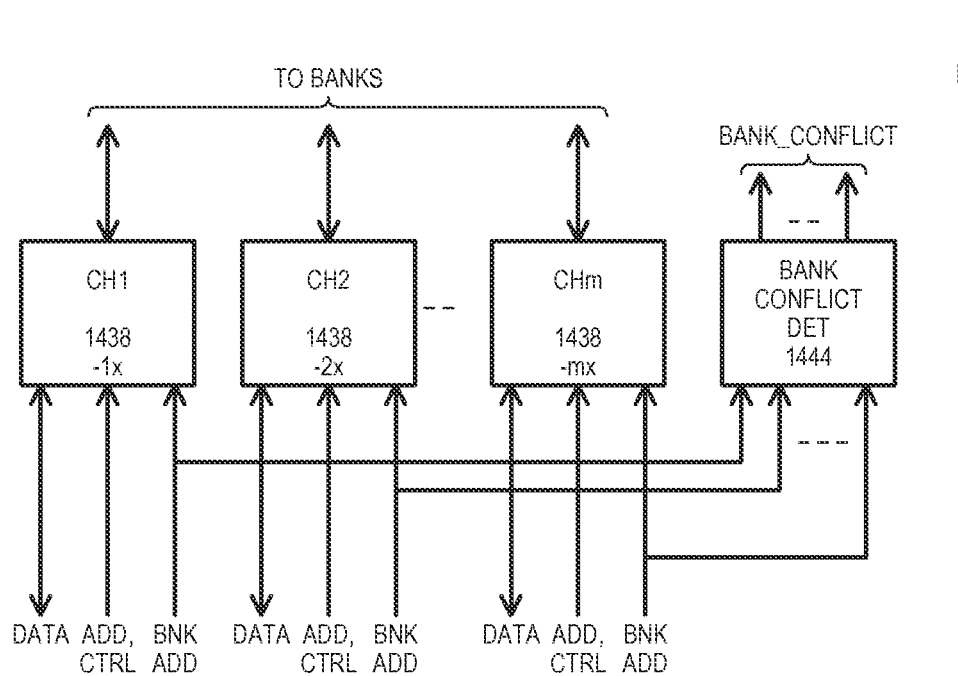
FIG. 14 is a block diagram of a channel group that can be included in embodiments.

FIG. 14 is a block schematic diagram of a channel group 1436 according to an embodiment. In the embodiment shown, a channel group 1436 can include multiple channels 1438-1x to -mx and a bank conflict detect circuit 1444. Channels (1438-1x to -mx) can each include address and control inputs (ADD,CTRL), a bank address input (BNK ADD), and data inputs and outputs (DATA). In the particular embodiment shown, data lines are bi-directional, using the same data lines to output read data and input write data. However in other embodiments, data lines can include two sets of uni-directional lines, one set for read data and one set for write data.

A bank conflict detect circuit 1444 can receive bank addresses from the channels (1438-1x to -mx) of its corresponding channel group 1426, and can determine if any bank addresses are the same for two (or more) channels of the channel group 1436. Such same bank addresses can indicate a bank accesses by channels of the same channel group to a same bank. In some embodiments, bank conflict detect circuit 1444 can generate one or more bank conflict indications BANK_CONFLICT when same bank addresses are detected.

Bank conflicts (e.g., accesses to the same bank by channels of the same channel group) can be handled in any of a number of ways. In some embodiments, both such accesses can be prevented, thus both such accesses can be considered invalid. In some embodiments, such prevention can occur at the bank level, by preventing the bank addresses from being forwarded to other circuits (e.g., bank access circuit 1108 of FIG. 11) which connect the channels to the banks. In other embodiments, such prevention can be handled at the bank itself, with address/control values being prevented from being applied to the bank. In some embodiments, bank conflicts can be handled by an arbitration scheme which can give priority to some channels in a channel group over other channels in the same channel group. Other bank conflict approaches can be employed based on the application in which the memory device is being used.

While FIG. 12 shows operations in which accesses to banks can occur at two different times within a same cycle of CLK_SYS, in alternate embodiments, more than two such accesses can occur, creating even greater flexibility in simultaneous bank access timing. One such embodiment is shown in FIG. 15.

Figure 15:
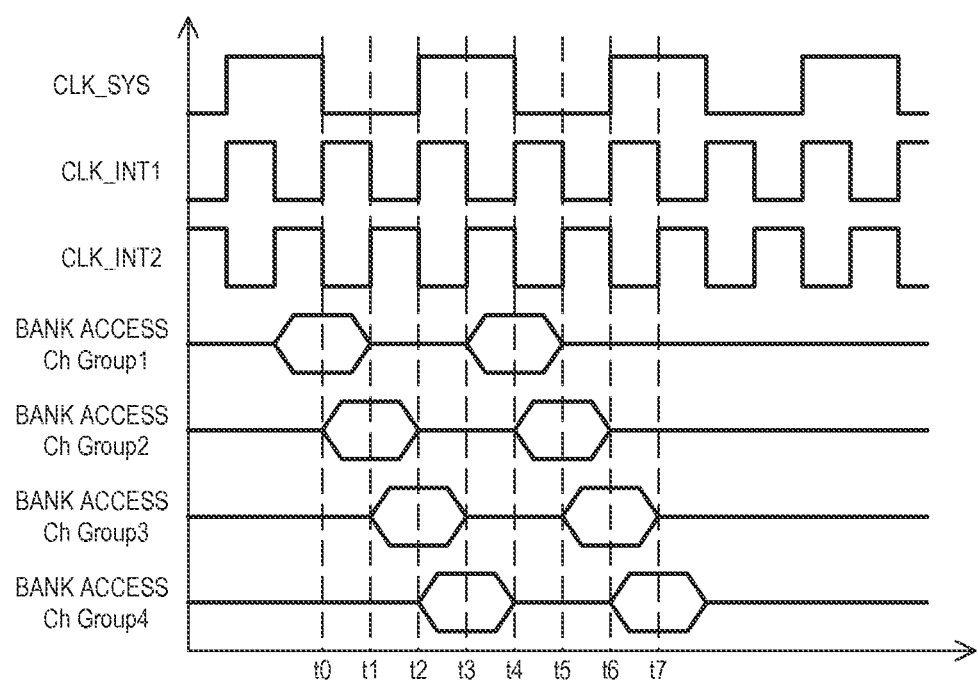
FIG. 15 is a timing diagram showing memory device operations according to another embodiment.

FIG. 15 is a timing diagram showing an arrangement in which accesses to banks from different channel groups can occur at four different times within a cycle of CLK_SYS. Two internal timing signals are shown, CLK_INT1 and CLK_INT2, each operating at twice the frequency of CLK_SYS, and phase shifted from one another by 180°. Possible access times for different channel groups are shown as BANK ACCESS Ch Group1, BANK ACCESS Ch Group2, BANK ACCESS Ch Group3, and BANK ACCESS Ch Group4.

In the example shown, accesses from Group1 can occur at times t0 and t4, on the rising edges of clock CLK_INT1. Accesses from Group2 can occur at times t1 and t5 on rising edges of clock CLK_INT2. Accesses from Group3 can occur at times t2 and t6, on rising edges of clock CLK_INT1 that occur between those of Group1. Accesses from Group4 can occur at times t3 and t7, on rising edges of clock CLK_INT2 that occur between those of Group2.

Figure 16:
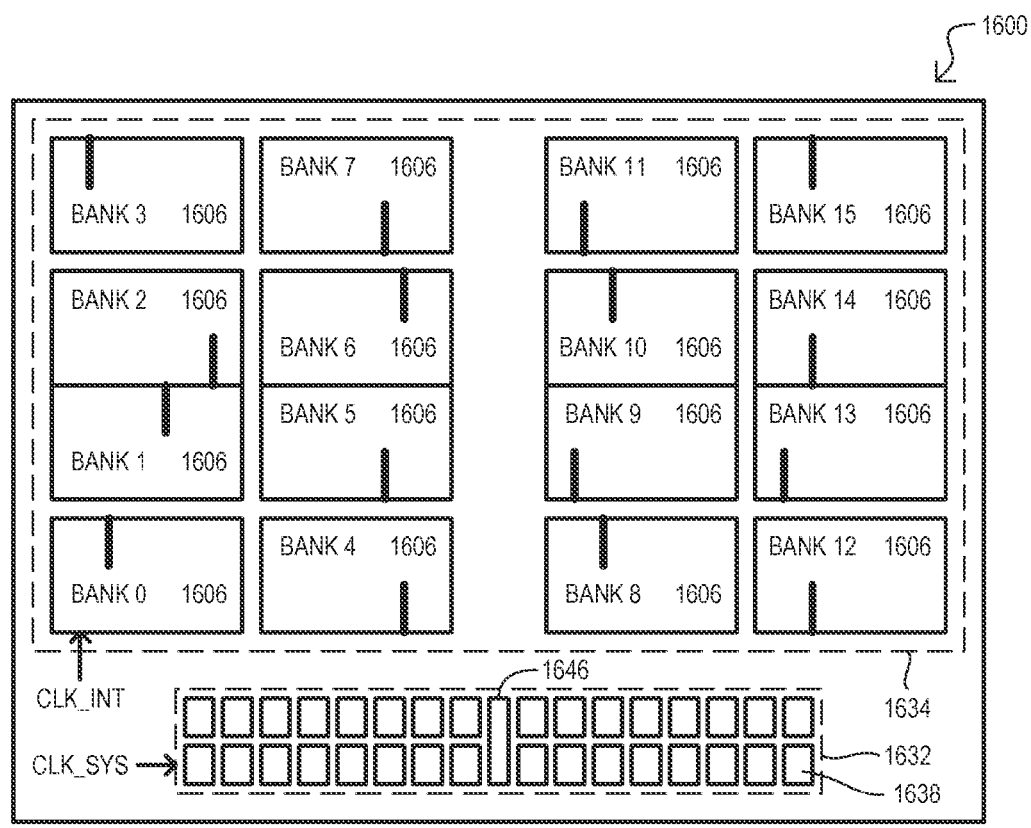
FIG. 16 is a block diagram of another memory device according to an embodiment.

FIG. 16 is a block diagram of a memory device 1600 according to another embodiment. A memory device 1600 can include a memory section 1634 and I/O section 1632. Memory section 1634 can include 16 internal banks (BANK 0 to BANK 15) 1606, which can be accessed according to a bank address, such as a four bit bank address BA3, BA2, BA1, BA0. A memory section 1634 can also include bank access circuits (not shown) as described herein, or equivalents.

I/O section 1632 can include a number of channels (one shown as 1638), organized into channel groups. In some embodiments, channel groups can be programmable, according to an I/O configuration circuit 1646. Channels (e.g., 1638) can take the form of any of those described herein, or equivalents. Channels (e.g., 1638) can receive input signals (e.g., control, address, data) in synchronism with a system clock CLK_SYS.

Accesses to banks (e.g., 1606) can occur according to an internal clock CLK_INT that is double the frequency of the input clock (CLK_SYS) frequency.

Accesses to banks (e.g., 1606) can start on every rising edge of the internal double frequency clock (CLK_INT), and have phase detect for input clock (phase 0/1). Channels of one channel group (e.g., Group0) can access banks (e.g., 1606) on phase0 of the input clock CLK_INT, while channels of the other group (Group1) can access banks (e.g., 1606) on phase 1 of the input clock (CLK_INT).

According to embodiments, there can be bank restrictions only for channels of the same group, to avoid bank conflicts. However, there can be no restrictions for channels corresponding to different phases (i.e., phase0/1).

In one very particular embodiment, there can be 16 banks (e.g., 1606), and an I/O section can be a wide I/O interface. In some embodiments, a wide I/O interface can have more than 600 data IO connections (not including address and control inputs). A wide I/O interface can include at least 14 data connections per channel. In this way, a very high degree of bank access flexibility can be provided for a memory device having a wide I/O configuration.

Figure 17A:
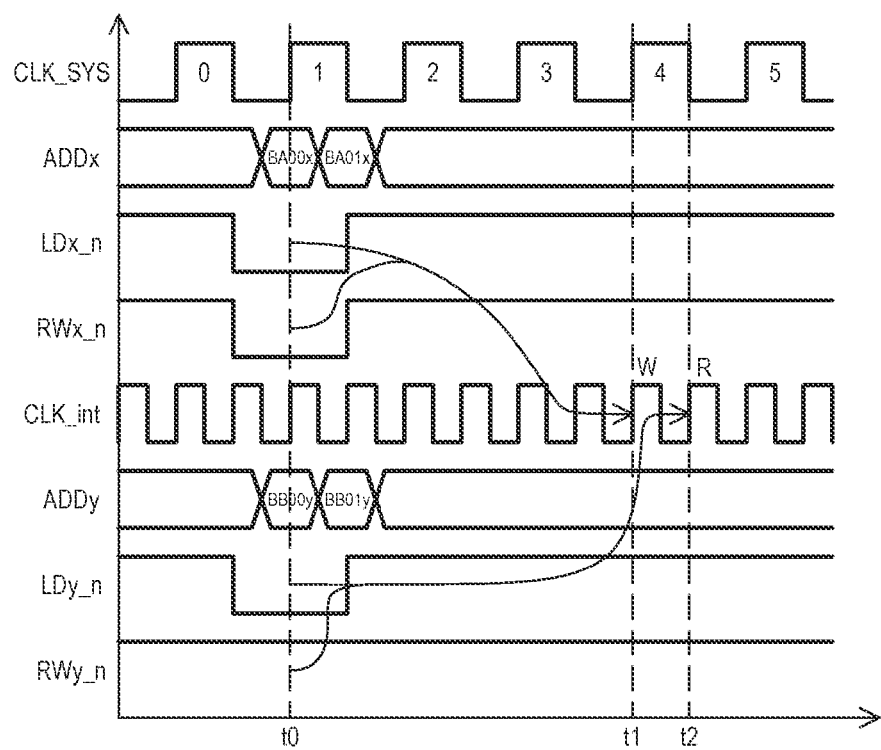
FIGS. 17A and 17B are timing diagrams showing memory device operations according to particular embodiments.
Figure 17B:
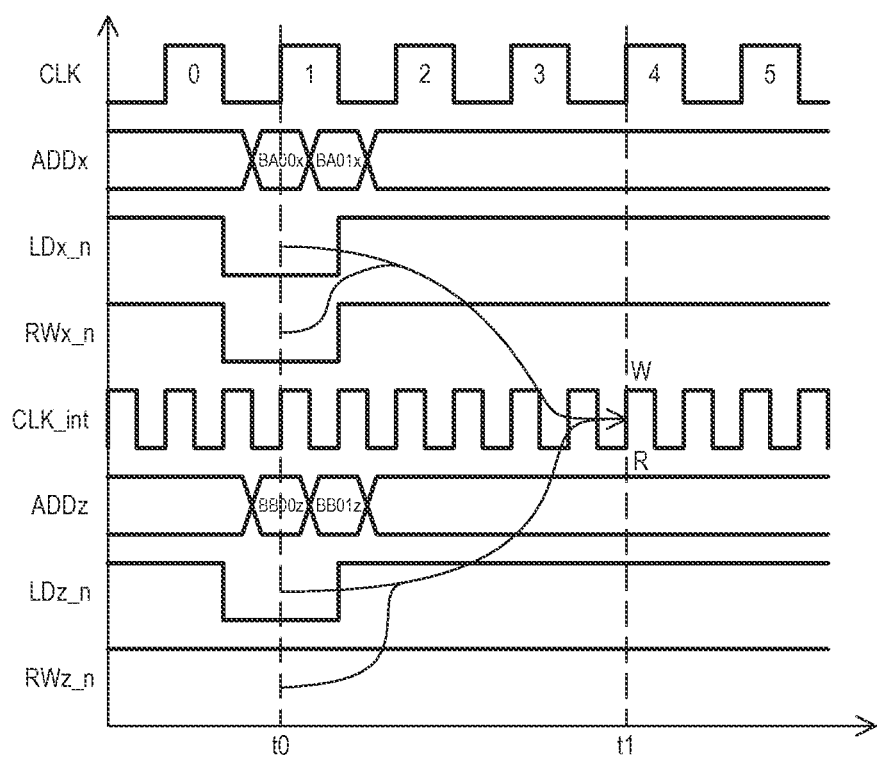

FIGS. 17A and 17B are timing diagrams showing access operations of a memory device according to embodiments. FIG. 17A includes a waveform for a system clock CLK_SYS, address inputs for a first channel ADDx, a load input for the first channel LDx_n, a read/write input for the first channel RWx_n, an internal clock CLK_INT, address inputs for a second channel ADDy, a load input for the second channel LDy_n, and a read/write input for the second channel RWy_n.

In the embodiment shown, address values ADD can be received (e.g., sampled) on rising edges of CLK_SYS but at a "double data rate" with respect to the system clock CLK_SYS. Thus, address values (BA00$x$ and BA01$x$) can be a total address value for an access. Load inputs (LDx/y_n) can be active low values, which enable commands to be input to the device. Load inputs (LDx/y_n) are sampled on rising edges of CLK_SYS. Read/write inputs (RWx/y_n) can be a command input which indicates a read or write operation. In the embodiment shown, a low read/write input (RWx/y_n) can indicate a write command, while a high read/write input (RWx/y_n) can indicate a read command. Read/write inputs (RWx/y_n) are sampled on rising edges of CLK_SYS.

Internal clock (CLK_INT) can operate at double the frequency of CLK_SYS.

In the embodiment shown, address value BA00$x$ can be a bank A phase 0 address and address value BA01$x$ can be a bank A phase 1 address from a channel x. Address value BB00$y$ can be a bank B phase 0 address and address value BB01$y$ can be a bank B phase 1 address from channel y. LDx_n is a command load signal from channel x and RWx_n is read/write signal from channel x. LDy_n is command load signal from channel y and RWy_n is read/write signal from channel y.

It is noted that if channel x and channel y are from different channel groups, the bank A address and bank B address can be the same, as accesses occur at different cycles of CLK_INT. More particularly, both such accesses (write to BA00/BA01, read from BB00/BB01 can be initiated at time t0, but the write access can occur at time t1, while the read access occurs at time t2.

FIG. 17B includes a waveforms like those if FIG. 17B, except it shows accesses for channel x and another channel z. Unlike channel y shown in FIG. 17A, channel z accesses banks in the same phase as channel x. Thus, if channel x and channel z are from a same channel group, the bank A address and bank B address will be for different banks, as a bank conflict would arise were they the same bank.

Embodiments described herein can provide greater flexibility in accessing multiple banks of a memory device as compared to conventional approaches, such as those that can require the insertion of "no operation" cycles (NOPs) or those that limit operation types (i.e., reads always on one edge of input clock, writes on other edge), as but two examples. Such flexibility can be provided with little, if any, impact on speed and latency as compared to such conventional approaches. As understood from above, bank restrictions can be applied only to channels of a same groups, rather than to all channels.

While embodiments have shown bank accesses occurring twice or four times within an input clock (e.g., CLK_SYS), alternate embodiments can have different numbers of multiple bank accesses within a same clock cycle.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
a plurality of banks, each including a plurality of memory cells, and separately accessible according to a received bank address value, each bank configured to enable accesses on different phases of a same cycle of a clock signal; and
a plurality of channel groups, each channel group including a plurality of channels, each channel including its own data connections, address connections, and control input connections for accessing the banks, the channels of different groups accessing the memory banks on the different phases of the clock signal.

2. The IC device of claim 1, further including:
a conflict detect circuit corresponding to each channel group, each conflict detect circuit configured to compare bank addresses received at each channel of the group, and to generate at least one group conflict signal if a same address is received at two or more of the channels in the channel group.

3. The IC device of claim 2, wherein:
the conflict detect circuit is configured to generate a channel conflict signal for each channel of its channel group that receives a same bank address; and
each channel in a channel group disables an access operation in response to receiving a channel conflict signal.

4. The IC device of claim 2, wherein:
the conflict detect circuit is configured to generate a channel conflict signal for each bank that is accessed by more than one channel of its channel group; and
each bank disables an access operation in response to receiving a channel conflict signal.

5. The IC device of claim 1, wherein:
the number of banks is no less than 4.

6. The IC device of claim 1, wherein:
the number of channels is no less than 8.

7. The IC device of claim 1, wherein:
the data connections of each channel include no less than 16 bi-directional data connections.

8. A method, comprising:
accessing storage locations in a plurality of banks, each bank including a plurality of memory cells, and being separately accessible according to a received bank address value, each bank configured to be accessed on different phases of a same cycle of a clock signal; and accessing any of the banks via channels organized into a plurality of channel groups, each channel group including a plurality of channels, each channel including its own data connections, address connections, and control input connections, the channels of different groups accessing the memory banks on the different phases of the clock signal.

9. The method of claim 8, wherein:

accessing any of the banks includes receiving address values at channels of different channel groups in synchronism with a system clock;

accessing any bank from one channel in synchronism with an internal clock; and accessing any bank from another channel on a subsequent cycle of the internal clock; wherein the internal clock has a frequency that is a multiple of the system clock.

10. The method of claim 9, wherein:

the frequency of the internal clock is twice that of the system clock.

11. The method of claim 8, wherein:

programming the channels into a particular channel grouping from a plurality of possible channel groupings.

12. The method of claim 8, further including:

determining if any channels of the same channel group receive a same bank address at the same time.

13. The method of claim 12, wherein:

if any channels of the same channel group receive the same bank address, disabling accesses from those channels.

14. The method of claim 12, wherein:

if any channels of the same channel group receive the same bank address, disabling accesses to the bank from those channels.

15. A system, comprising:

a memory section that includes a plurality of banks, each bank having storage locations separately accessible according to a received bank address value, each bank configured to enable accesses on different phases of a clock signal; and an input/output (I/O) section that includes a plurality of channel groups, each channel group including a plurality of channels, each channel receiving its own address signals and control input signals for accessing the banks with read or write operations, the channels of different groups accessing the memory banks on the different phases of the clock signal; wherein simultaneous accesses to the same bank received at channels of different channel groups are enabled, and simultaneous accesses to the same bank received at channels of a same channel groups are disabled.

16. The system of claim 15, further including:

the I/O section receives the address signals in synchronism with the clock signal; and an internal clock generator configured to generate the internal clock signal with a clock multiplier that multiplies the clock signal.

17. The system of claim 15, further including:

a conflict detect circuit configured to determine if bank addresses received at channels of a same group are the same.

18. The system of claim 15, further including:

a conflict detect circuit configured to determine if more than two accesses to the same bank are attempted on a same phase of the clock signal.

19. The system of claim 15, further including:

disable circuits configured to prevent accesses to a same bank by more than one channel of the same channel group.

20. The system of claim 15, wherein:

the memory section and I/O section are formed in a same integrated circuit device.

* * * * *